(12) United States Patent
Morrow et al.

(10) Patent No.: US 10,236,282 B2
(45) Date of Patent: Mar. 19, 2019

(54) PARTIAL LAYER TRANSFER SYSTEM AND METHOD

(71) Applicant: Intel Corporation, Santa Clara, CA (US)

(72) Inventors: Patrick Morrow, Portland, OR (US); Kimin Jun, Hillsboro, OR (US); Il-Seok Son, Portland, OR (US); Rajashree Baskaran, Seattle, WA (US); Paul B. Fischer, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/026,268

(22) PCT Filed: Dec. 18, 2013

(86) PCT No.: PCT/US2013/075947
§ 371 (c)(1),
(2) Date: Mar. 31, 2016

(87) PCT Pub. No.: WO2015/094208
PCT Pub. Date: Jun. 25, 2015

(65) Prior Publication Data
US 2016/0233206 A1     Aug. 11, 2016

(51) Int. Cl.
*H01L 27/02*     (2006.01)
*H01L 21/8258*     (2006.01)
(Continued)

(52) U.S. Cl.
CPC ...... *H01L 27/0203* (2013.01); *H01L 21/6835* (2013.01); *H01L 21/8258* (2013.01);
(Continued)

(58) Field of Classification Search
CPC ..... H01L 27/0203; H01L 29/20; H01L 29/16; H01L 27/085; H01L 21/6835;
(Continued)

(56) References Cited

U.S. PATENT DOCUMENTS

| | | |
|---|---|---|
| 6,455,398 B1 | 9/2002 | Fonstad, Jr. et al. |
| 6,593,212 B1 | 7/2003 | Kub et al. |

(Continued)

FOREIGN PATENT DOCUMENTS

| | | |
|---|---|---|
| CN | 102315149 A | 1/2012 |
| CN | 102376653 A | 3/2012 |

(Continued)

OTHER PUBLICATIONS

International Searching Authority, "Notification of Transmittal of the International Search Report and the Written Opinion of the International Searching Authority," dated Sep. 12, 2014, in International application No. PCT/US2013/075947.

(Continued)

*Primary Examiner* — Moazzam Hossain
*Assistant Examiner* — Stanetta Isaac
(74) *Attorney, Agent, or Firm* — Trop, Pruner & Hu, P.C.

(57) ABSTRACT

An embodiment includes an apparatus comprising: a first layer, including a first semiconductor switching element, coupled to a first portion of a first bonding material; and a second layer, including a second semiconductor switching element, coupled to a second portion of a second bonding material; wherein (a) the first layer is over the second layer, (b) the first portion is directly connected to the second portion, and (c) first sidewalls of the first portion are unevenly serrated. Other embodiments are described herein.

25 Claims, 4 Drawing Sheets

(51) Int. Cl.
  *H01L 21/683* (2006.01)
  *H01L 23/528* (2006.01)
  *H01L 29/16* (2006.01)
  *H01L 29/20* (2006.01)
  *H01L 27/085* (2006.01)

(52) U.S. Cl.
  CPC ............ *H01L 23/528* (2013.01); *H01L 29/16* (2013.01); *H01L 29/20* (2013.01); *H01L 27/085* (2013.01); *H01L 2221/68363* (2013.01)

(58) Field of Classification Search
  CPC . H01L 23/528; H01L 21/8258; H01L 21/187; H01L 21/02365; H01L 2221/68363; H01L 21/2007; H01L 21/76251; H01L 33/0079
  See application file for complete search history.

(56) References Cited

U.S. PATENT DOCUMENTS

| | | |
|---|---|---|
| 2002/0100917 A1 | 8/2002 | Chu et al. |
| 2004/0245616 A1 | 12/2004 | Kloster et al. |
| 2008/0237736 A1 | 10/2008 | Sakurai et al. |
| 2009/0017598 A1 | 1/2009 | Shimomura et al. |
| 2010/0006972 A1 | 1/2010 | La Tulipe, Jr. et al. |
| 2011/0217825 A1 | 9/2011 | Ghyselen et al. |
| 2012/0006463 A1 | 1/2012 | Gaudin |
| 2012/0013013 A1* | 1/2012 | Sadaka ............... H01L 23/5384 257/773 |
| 2012/0043647 A1 | 2/2012 | Gaudin |
| 2012/0088355 A1 | 4/2012 | Sekar et al. |
| 2012/0256164 A1 | 10/2012 | Chen et al. |
| 2013/0189804 A1* | 7/2013 | Marchena ......... H01L 21/76251 438/28 |

FOREIGN PATENT DOCUMENTS

| | | |
|---|---|---|
| JP | 2009038358 | 2/2009 |
| TW | 522494 B | 3/2003 |
| TW | 200845362 A | 11/2008 |

OTHER PUBLICATIONS

European Patent Office, Extended European Search Report dated Jun. 23, 2017 in European Patent Application No. 13899740.8.

Taiwan Intellectual Property Office, Office Action dated Dec. 23, 2015 in Taiwanese patent application No. 103139776.

State Intellectual Property Office, Office Action dated Jul. 27, 2018 in Chinese Patent Application 201380081028.6, 11 pages.

* cited by examiner

US 10,236,282 B2

PARTIAL LAYER TRANSFER SYSTEM AND METHOD

TECHNICAL FIELD

An embodiment addresses lattice mismatched semiconductor devices.

BACKGROUND

A variety of electronic and optoelectronic devices can be enabled by developing, for example, high quality III-V semiconductors on elemental silicon (Si) substrates or IV semiconductors on Si substrates. Surface layers capable of achieving the performance advantages of III-V or IV materials may host a variety of high performance electronic devices such as CMOS and quantum well (QW) transistors fabricated from extremely high mobility materials such as, but not limited to, indium antimonide (InSb), indium arsenide (InAs), germanium (Ge), and silicon germanium (SiGe). Optical devices, such as lasers, detectors and photovoltaics, as well as electronic devices may also be fabricated from various other direct band gap materials, such as, but not limited to, gallium arsenide (GaAs) and indium gallium arsenide (InGaAs).

The growth of III-V and IV materials upon Si substrates, however, presents many challenges. Crystal defects are generated by lattice mismatch, polar-on-nonpolar mismatch, and thermal mismatch between the III-V semiconductor epitaxial (EPI) layer and the Si semiconductor substrate or the IV semiconductor EPI layer and the Si semiconductor substrate. When the lattice mismatch between the EPI layer and substrate exceeds a few percent, the strain induced by the mismatch becomes too large and defects are generated in the EPI layer. Once the film thickness is greater than the critical thickness (i.e., film is fully strained below this thickness and partially relaxed above this thickness), the strain is relaxed by creating misfit dislocations at the film and substrate interface as well as in the EPI film. The EPI crystal defects may be in the form of threading dislocations, stacking faults and twins. Many defects, particularly threading dislocations and twins, tend to propagate into the "device layer" where the semiconductor device is fabricated. Generally, the severity of defect generation correlates to the amount of lattice mismatch between the III-V semiconductor and the Si substrate or the IV semiconductor and the Si substrate.

BRIEF DESCRIPTION OF THE DRAWINGS

Features and advantages of embodiments of the present invention will become apparent from the appended claims, the following detailed description of one or more example embodiments, and the corresponding figures, in which:

DETAILED DESCRIPTION

Figure 4:
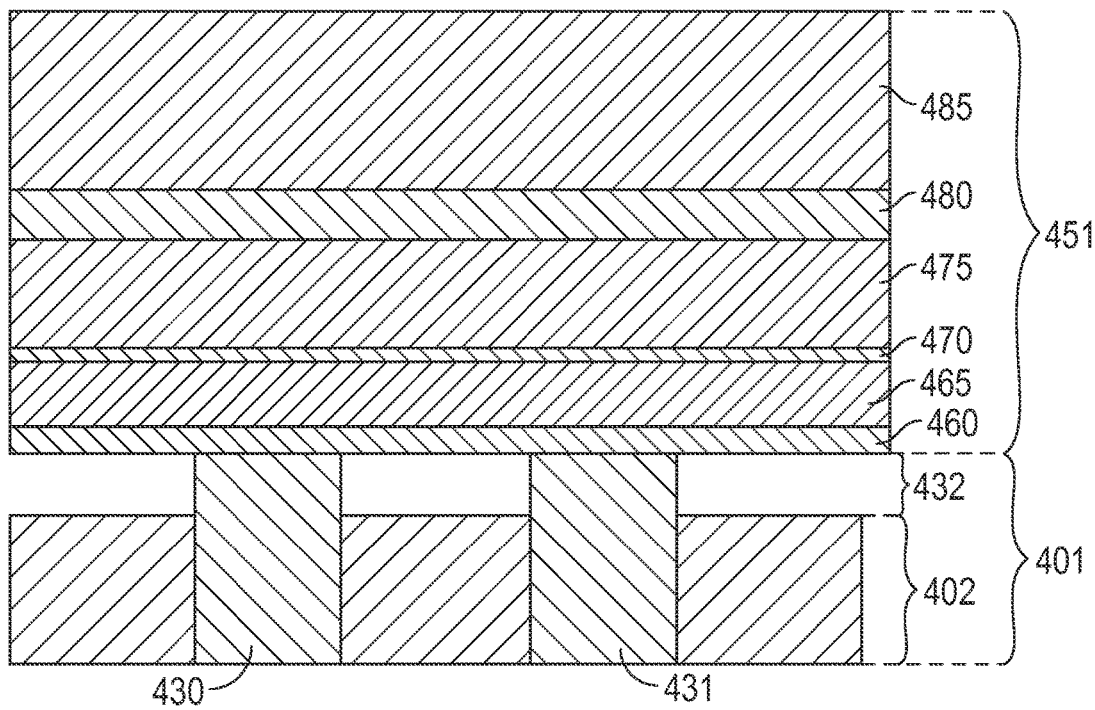
FIG. 4 depicts coupled donor and receiver wafers in an embodiment of the invention before partial layer transfer is completed.

Reference will now be made to the drawings wherein like structures may be provided with like suffix reference designations. In order to show the structures of various embodiments more clearly, the drawings included herein are diagrammatic representations of semiconductor/circuit structures. Thus, the actual appearance of the fabricated integrated circuit structures, for example in a photomicrograph, may appear different while still incorporating the claimed structures of the illustrated embodiments. Moreover, the drawings may only show the structures useful to understand the illustrated embodiments (for example, portion 401 of FIG. 4 is simplified to better focus on the coupling portions of layers 401, 451 rather than focus on detail (such as transistors) for layer 401). Additional structures known in the art may not have been included to maintain the clarity of the drawings. For example, not every layer of a semiconductor device is necessarily shown. "An embodiment", "various embodiments" and the like indicate embodiment(s) so described may include particular features, structures, or characteristics, but not every embodiment necessarily includes the particular features, structures, or characteristics. Some embodiments may have some, all, or none of the features described for other embodiments. "First", "second", "third" and the like describe a common object and indicate different instances of like objects are being referred to. Such adjectives do not imply objects so described must be in a given sequence, either temporally, spatially, in ranking, or in any other manner. "Connected" may indicate elements are in direct physical or electrical contact with each other and "coupled" may indicate elements co-operate or interact with each other, but they may or may not be in direct physical or electrical contact. Also, while similar or same numbers may be used to designate same or similar parts in different figures, doing so does not mean all figures including similar or same numbers constitute a single or same embodiment.

Figure 1:
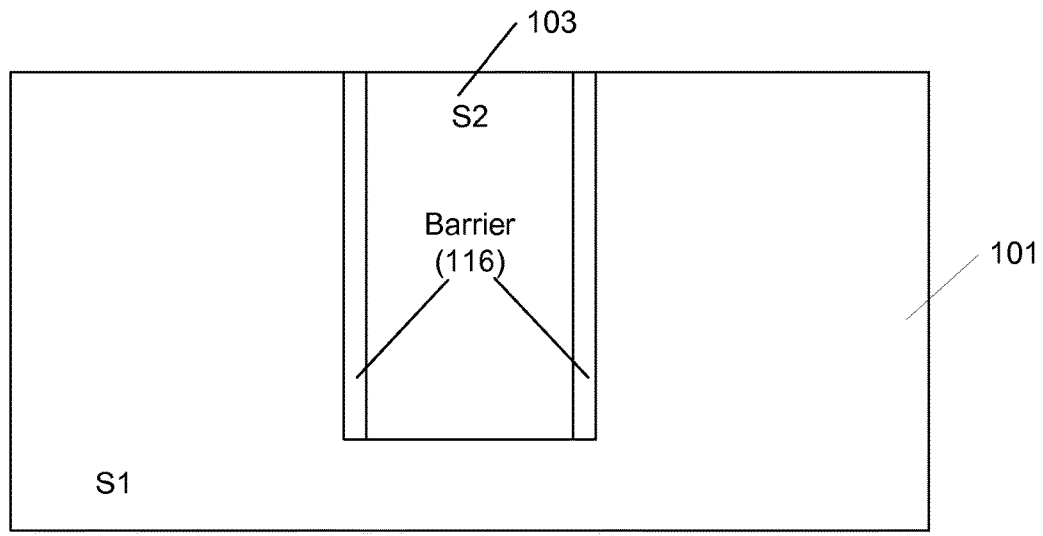
FIG. 1 depicts a conventional aspect ratio confinement structure.

A conventional technique for managing lattice mismatch includes Aspect Ratio Trapping (ART). ART is based on threading dislocations that propagate upwards at a specific angle. As seen in FIG. 1, in ART a trench is made in a first semiconductor (S1) 101 with a high enough aspect ratio such that the defects in a second semiconductor (S2) 103 located in the trench terminate on the sidewall of the trench and any layer above the terminations is defect free. The trench may or may not include a barrier 116.

Figure 2:
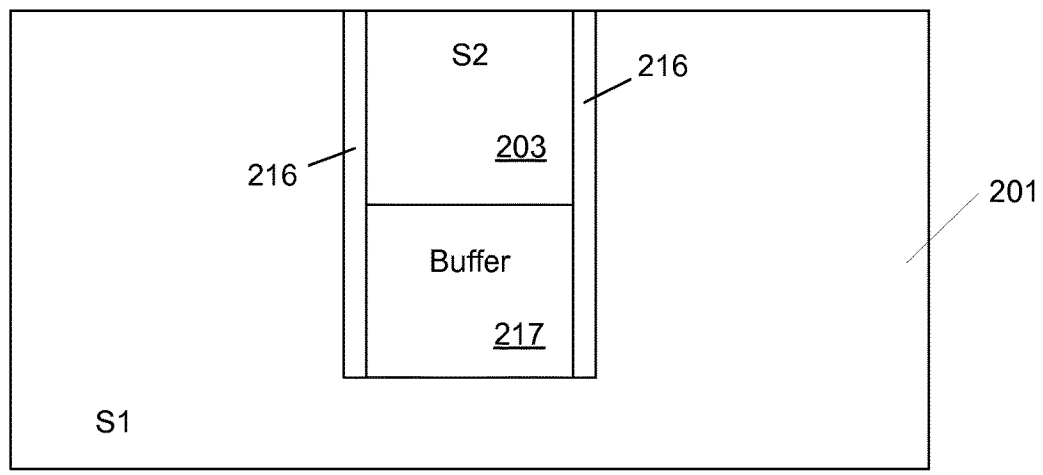
FIG. 2 depicts a conventional lattice mismatch bridging buffer.

As seen in FIG. 2, another conventional technique to manage defects in lattice mismatched configurations involves deposition of a thick buffer 217 (e.g., 0.5 or more microns thick) that bridges the lattice constant difference between the S1 substrate 201 and the layers of interest (e.g., device layers including III-V materials S2 203 and the like). The buffer may between barrier portions 216. In such conventional techniques complicated anneals and compositional grading processes are used to "bend" the defects into each other within the thick buffer so the defects annihilate. Many thick buffer techniques are time consuming, expensive, include undesirable surface roughness of the buffer, and the minimum defect density still remains high.

Further, as scaling progresses and devices get smaller, the space available for a trench or well shrinks. However, the buffer cannot be easily scaled. Therefore, a buffer may need to be coupled with an ART structure. Although ART can reduce the necessary transition layer/buffer thickness, the ART structure itself needs very high aspect ratio patterning. And as scaling progresses, the fabrication of the very high aspect ratio structure becomes more difficult as the space available for the structure (e.g., trench) is limited with smaller devices.

While there are certain groups of materials which have very similar lattice parameters (e.g., Germanium and Gallium Arsenide), there has been limited success integrating these materials with one another in a heterogeneous manner without use of a buffer (or with using a small buffer).

In addition to ART and buffer based technologies, heterogeneous integration of materials with very different lattice constants may be addressed through a layer transfer process. However, layer transfer has drawbacks as well. For example, layer transfer typically involves the transfer of an entire layer from a donor wafer to a similarly sized receiving wafer. Thus, the transfer has "low granularity" and is not ideal for implementing layer transfer for some parts of a receiving wafer but not for other parts of that same wafer.

In contrast, an embodiment involves layer transfer, but only a partial amount of the receiving wafer is covered by the transferred layer. After partial layer transfer is complete various embodiments include "islands" of transferred heterogeneous configurations of material, wherein the islands from the donor receiver are now joined to the receiving wafer without covering (or almost covering) the entire receiving wafer. This may lead to cost reduction (only a portion of a donor wafer is used instead of an entire layer from the donor wafer) or interconnect integration simplification in some cases. For example, compared to full wafer layer transfer, having islands of transferred material will eliminate having to etch areas to enable the inter-layer interconnects (as would be the case with traditional layer transfer), or if the desired inter-strata interconnects are very large, an electroplating process can be accomplished more simply.

Not only can such an embodiment lead to cost reduction by using only a portion of a donor wafer, the donor wafer itself need not be the same size as the receiving donor (as is typically the case with conventional layer transfer). In other words, for complete layer transfer conventionally the donor and receiver wafers "match up" dimensionally so the entire transferred layer blankets or covers the entire receiving wafer. But in an embodiment the donor wafer is smaller than the receiving wafer (but in other embodiments the donor wafer may be equal in size or larger in size than the receiving wafer). Having a donor wafer that is smaller than the receiving wafer may be desirable because the donor wafer may include an exotic non-Si material. Growing such exotic materials and corresponding devices can be difficult to do on larger wafer diameters (e.g., 300 mm diameter wafer).

Regardless of donor and/or receiver wafer size, various embodiments provide methods of partially transferring a layer of material (e.g., single crystal material) from a donor wafer to a receiver wafer. Doing so may help manage lattice mismatch between the material of the donor wafer and some other material in the receiving wafer that has a lattice mismatch with the material (e.g., single crystal material) of the donor wafer. More generally, embodiments may help manage lattice mismatch between a material of the donor wafer and some other material in the receiving wafer that has a lattice mismatch with the material of the donor wafer.

Embodiments facilitate partial layer transfer through controlled bonding in only desired areas on the receiving wafer, which can be accomplished in different manners as described below. Also, such embodiments allow for devices (e.g., switching devices such as diodes and transistors) to be fabricated after layer transfer. For example, a donor wafer portion including a first device may be transferred to a receiving wafer which may have devices already constructed at the time of transfer. Another example is when the donor wafer may be simply a substrate where the device will be fabricated after layer transfer. In the first case (where the donor wafer already has a device at the time of transfer), the alignment is critical (and can be problematic) but in the second case (where the donor wafer does not already have a device at the time of transfer) alignment is not critical since the device will be fabricated after the layer transfer.

While various embodiments address heterogeneous material integration, other embodiments are suitable for partial layer transfer leading to homogenous material integration where there is little to no lattice mismatch or heterogeneous material integration of similar materials where there is little to no lattice mismatch.

Figure 3:
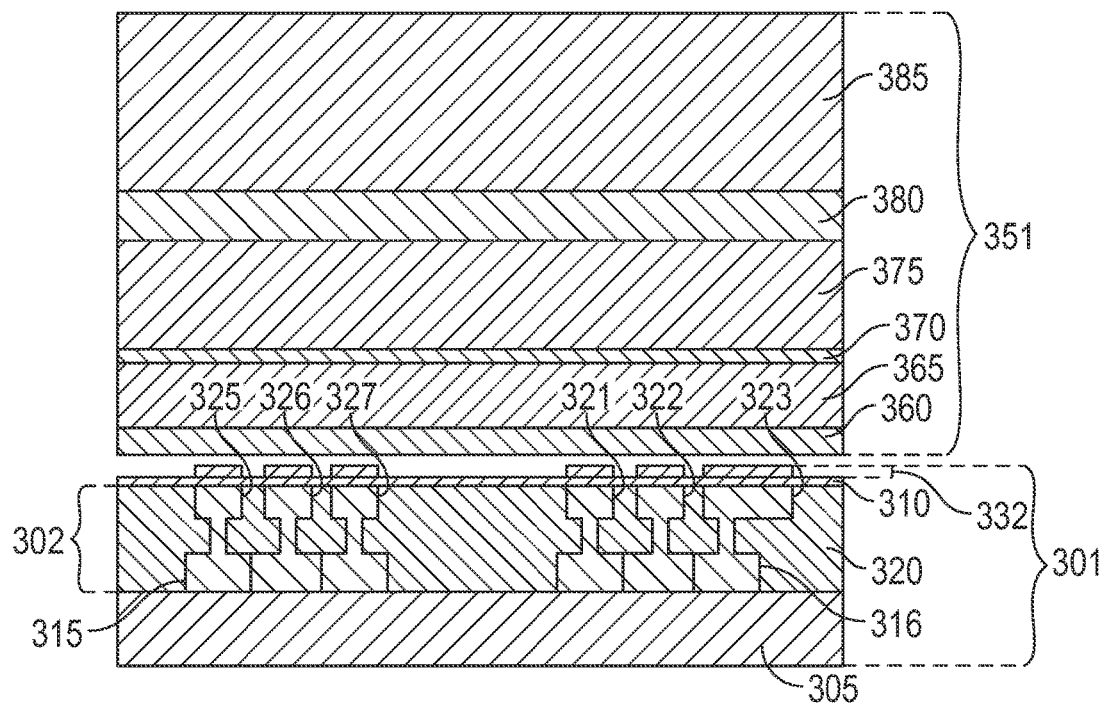
FIG. 3 depicts uncoupled donor and receiver wafers in an embodiment of the invention.

FIG. 3 depicts uncoupled donor and receiver wafers in an embodiment of the invention. This example includes a standard CMOS based receiving wafer 301 and a non-CMOS based donor wafer 351 (however other embodiments may include CMOS based donor and receiver wafers or non-CMOS based donor and receiver wafers).

Donor wafer 351 includes buffer 380 between a handling layer 385 (for coupling to process equipment) and device layer 365. Handling layer 385 may include a substrate for which a different material, such as layer 365 described below, is grown. Oxide 360 is formed on device layer 365. Oxide 360 is a bonding interface material used in this embodiment but other embodiments may include other bonding materials such as metals (e.g., Cu, Au, Ti, Ni, and the like). If temperature requirements are met, various polymer adhesives may also be suitable as bonding materials. Metal bonding can also be used to provide thermal or electrical connections between the layers. There is also an implanted cleaving layer 370, which may include hydrogen and/or helium (e.g., $5 \times 10^{16}$ ions/cm$^2$), and the like. Cleaving layer 370 will cause a fracture/crack for cleaving later in the process flow. Cleaving layer 370 may be included in a non-CMOS material or any other material that may present a lattice mismatch with the receiving wafer. Cleaving layer 370 may be formed within this material, thereby creating a portion for devices 365 and a portion 375 for abutting buffer 380.

The receiving wafer 301 has a lower layer 302 of "CMOS" devices fabricated with bonding structures 332, which are islands or raised areas of bonding material layer 310 (e.g., oxide or metal or polymer adhesive), which will be the areas where material from the donor layer is transferred to. In an embodiment, areas of portion 310 outside of the island portions 332 are completely etched off (not shown in figure). The devices of device layer 302 may include, for example, PMOS switching device 315 (illustrated in greatly simplified form) having source contact 325, gate contact 326, drain contact 327 and NMOS switching device 316 (illustrated in greatly simplified form) having source contact 323, gate contact 322, drain contact 321. Also, just as layer 302 includes devices such as transistors or diodes, layer 365 of the donor layer may also include such devices, although as stated before, alignment may become critical in such a case. Bonding material 310 may couple to additional bonding material 320, which is adjacent the devices of device layer 302. Device layer 302 may be on substrate 305 or any other layer. There may or may not be interconnect layers already formed above layer 302 or below layer 385.

FIG. 4 depicts coupled donor and receiver wafers in an embodiment of the invention before partial layer transfer is completed. Specifically, this shows layer 451 bonded to layer 401. FIG. 4 is drawn at a magnified and simplified perspective to better focus on the raised surfaces of portion 432, which couple receiver bonding material (e.g., oxide) portions 430, 431 to donor bonding material 460. Device layer 402 may still include devices and the like as was the case in FIG. 3, but those devices are no longer shown for sake of simplicity. Donor layer/wafer 451 still includes cleaving layer 470 with layers 465, 475 (along with buffer 480 and portion 485), which may be lattice mismatched with layer 402. In other words, while layer 451 is analogous to layer 351 of FIG. 3, layer 401 is only loosely analogous to layer 301 of FIG. 3 and lacks detail in order to better focus attention on the coupling islands of portion 432 (which may or may not be included below the top surface of layer 402 as shown in FIG. 4 but not in FIG. 3).

In FIG. 4 portions 430, 431 illustrate an embodiment where portions 432 includes a bonding material, such as oxide, that rises from within a device layer 402 to isolated islands above the device layer. The islands or raised portions 432 are the only areas (or some of a few areas) that couple the donor 451 and receiver 401 wafers. In an embodiment, raised area 432 only protrudes a few 10s of nm above the remaining surface of the receiving wafer. For example, in embodiments area 432 protrudes 10, 20, 30, 40, 50 or 60 nm above the surface of the receiving wafer. As shown in FIG. 4, the bonding raised surfaces may extend from the receiving wafer but in other embodiments those same raised surfaces may extend from layer 460 with the concept remaining that only selected raised portions of bonding material form the bonding interface between donor and receiving wafers (i.e., the bonding islands may be formed on the donor wafer, the receiving wafer, or the donor and receiving wafers in various embodiments).

Figure 5:
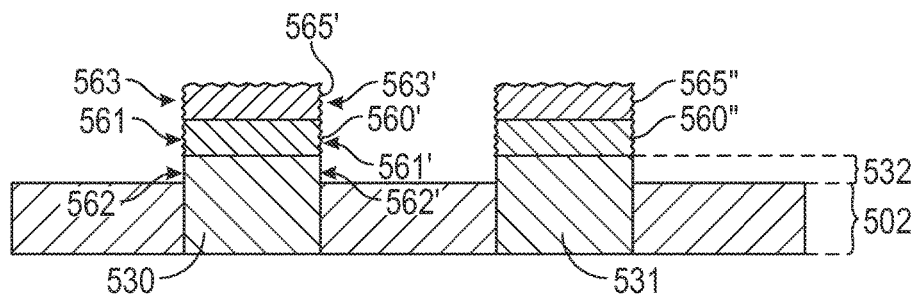
FIG. 5 depicts coupled donor and receiver wafers in an embodiment of the invention after partial layer transfer is completed.

FIG. 5 depicts coupled donor and receiver wafers in an embodiment of the invention after partial layer transfer is completed. More specifically, this shows device layer 502 with bonding portions 530, 531 as was the case with FIG. 4. However, in FIG. 5 cleaving has occurred (e.g., using heat and/or mechanical cleaving) at the cleaving layer leaving behind non-CMOS portions 565', 565" from layer 465 (and portions 560', 560" from layer 460). More specifically, after activating the cleaving layer 470 thermally at about 200-400 degrees Centigrade to form voids in the release interface, a portion of the seed/donor wafer that is located below the release interface is removed, or cleaved off, leaving behind body 565' attached to bonding material 560'.

In an embodiment a chemical-mechanical polish (CMP) process is performed to smooth the exposed surfaces atop portions 565', 565" (although they are shown roughened in FIG. 5) before or after interlayer dielectric (ILD) or the like is deposited around portions 565', 565".

Non-CMOS portions 565', 565" are formed on portions from layer 460 (i.e., 560', 560"). Portions 560', 560" couple to portions 530, 531. In some embodiments portions 560', 560" electrically and thermally couple directly to portions 530, 531.

In an embodiment the helium/hydrogen cleaving layer may be replaced by an etchable undercut material. In an embodiment the undercut material is chosen to have good etch selectivity to the rest of the materials exposed during the undercut process. In addition, the process involves removal of the top substrate in the undercut etch process. Undercutting can be accomplished with, for example, submersion or spray etch processes. Another method may include thinning the donor wafer back to the desired donor substrate thickness. This process may include grinding, wet or dry etching, and CMP to achieve the correct thickness and uniformity.

Thus, FIG. 5 depicts a first layer including portions 565', 565", which may include switching element(s) or other devices, coupled to portions 560', 560" of a bonding material (e.g., oxide). A second layer 502, possibly including a switching element or other device, couples to portion 530, 531 of a bonding material (e.g., oxide). The first layer is over the second layer. Also, portion 560' is directly connected to portion 530. Also, sidewalls 561, 561' of portion 560 are "unevenly serrated".

As used herein, the term "unevenly serrated" denotes a rougher surface than is ordinarily associated with semiconductor processing wherein no layer surface is typically completely smooth. However, the roughness of an "unevenly serrated" sidewall in this embodiment is caused due to fracturing that occurs during the cleaving process. For example, the entire layer or wafer portion 451 may only be 20 nm thick in some embodiments. As a result, when portion 451 is mechanically pulled off or separated from portion 401 the thinness of layer 451 causes fracturing/serration at the sidewalls 561, 561' because the sidewalls are located at the boundary of the bonded interface between portions 460 and 430, 431. This is not an edge formed via etching or polishing or smoothing but is instead formed by fracturing. As a result, sidewalls 561, 561' are rougher than the smoother sidewalls 562, 562' of portion 530 (because sidewalls 562, 562' were not formed from fracturing but instead from a prior processing step of the receiving wafer whereby, for example, a mask is used over portions 530, 531 to etch away oxide/bonding material to create the raised islands/areas of layer 432). In other words, the sidewalls 562, 562' are smoother than the sidewalls 561, 561'. Sidewalls 562, 562' are not unevenly serrated.

In an embodiment, upon cleaving and separation of the donor wafer from the receiving wafer, sidewalls 562, 562' are vertically aligned with sidewalls 561, 561'. However, as discussed below regarding FIG. 6, this is not always the case as the fracturing can be irregular sometimes leading to sidewalls 562, 562' (or at least some portion thereof) being horizontally separated from one another by a larger distance (or a smaller distance in some embodiments) than the distance that horizontally separates sidewalls 561, 561' (or at least some portion thereof) from one another (not shown).

In an embodiment additional sidewalls of the first layer, such as sidewalls 563, 563', are vertically aligned with sidewalls 561, 561' and/or 562, 562' and are unevenly serrated. They may be unevenly serrated or roughened because they too (like sidewalls 561, 561') were fractured during separation from the rest of portion 451. They may be more or less unevenly serrated than sidewalls 561, 561'.

In an embodiment sidewall 561 is generally orthogonal to layer 502 (see FIG. 5) but, due to the irregularity of the fracturing process whereby portions 560' and 565' are separated from the rest of portion 451, sidewall 561 (and/or sidewall 563) or similar sidewalls (e.g., sidewalls 561' and/or 563') may be angled non-orthogonally (see FIG. 6) to the generally horizontal layer 502.

In an embodiment layer or portion 565' is over and directly contacting portion 560' (but in other embodiments there may be intervening layers or portions), layer 565' includes a single crystal layer (SiGe) and portions 560', 530 each include an oxide.

In an embodiment a portion of layer 502 may include a CMOS switching element and portion 565' and/or 565" may include a non-CMOS switching element and vice versa. In an embodiment layers 565' and 502 respectively comprise first and second materials that each include at least one of group IV and III-V materials and the first material is not the same as the second material. In an embodiment this may cause the first and second materials to be lattice mismatched with each other.

In an embodiment a bonding layer is between the portions 560' and 530 but in other embodiments they directly connect to one another.

In an embodiment an oxide bonding portion, such as portion 530, has a section that that is co-planar with layer 502 and also has an upper most surface (atop the island) that extends above layer 502 by no more than 50 nm (but in other embodiments may extend above layer 502 y 10, 20, 30, 40, 60, 70, 80, 90 nm or more).

Figure 6:
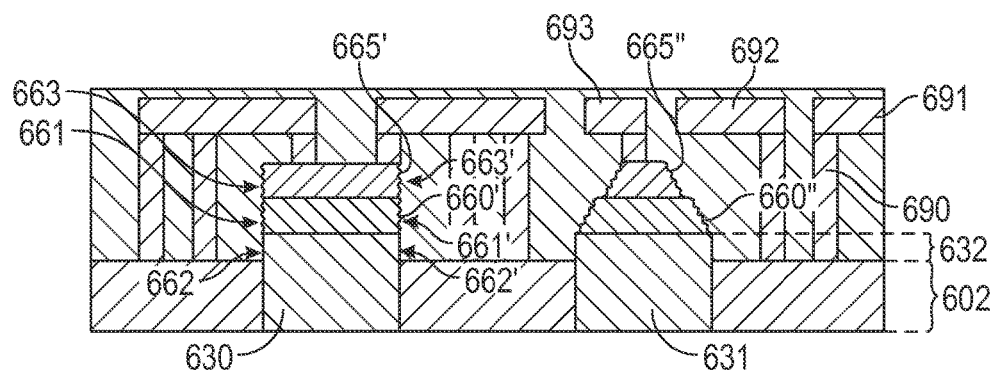
FIG. 6 depicts coupled donor and receiver wafers in an embodiment of the invention after partial layer transfer and interconnect build-up is completed.

FIG. 6 depicts coupled donor and receiver wafers in an embodiment of the invention after partial layer transfer and interconnect build-up is completed. For example, interconnect structures 690, 691, 692, 693 contact portions 665', 665", 602 and the like. This can be done with various conventional processes/materials. Thus, FIG. 6 depicts an interconnect (e.g., interconnect 690) extending from the first layer to the second layer. The top surfaces of portions 665' and 665" have been polished (CMP) so they are smooth (however in other embodiments they may be serrated).

Furthermore, in an embodiment the sidewall of portion 665" is "pulled back" or recessed from the sidewall of 660" (forming a shelf atop portion 660" that is not covered by portion 665") and is also non-orthogonal to layer 602. Furthermore, as discussed above, the sidewall of 660" is "pulled back" or recessed from the sidewall of portion 631 (forming a shelf atop portion 631 that is not covered by portion 660") and is also non-orthogonal to layer 602. The horizontal breadth/distance between sidewalls of 665" may be less than the horizontal breadth/distance between sidewalls of 660". This may provide the "shelf" whereby a portion of the top surface of 660" is exposed (before being covered in subsequent processing) and connects the top of a sidewall of 660" to the bottom of a sidewall of 665". As shown in FIG. 6, just because one or more sidewalls above portion 631 are recessed or "pulled back" and/or non-orthogonal to layer 602 does not necessarily mean that other sidewalls above portion 630 are either recessed or non-orthogonal to portion 630.

Figure 7:
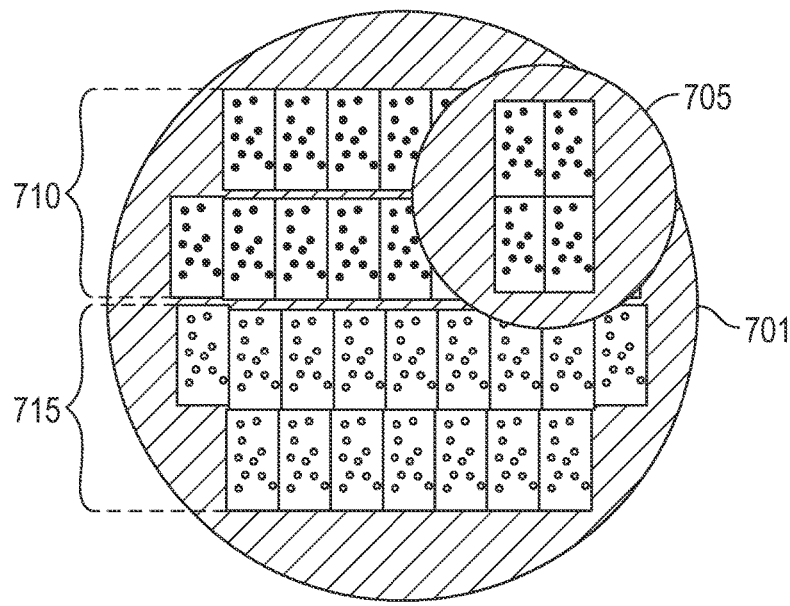
FIG. 7 depicts a stage in a partial layer transfer method in an embodiment of the invention.

FIG. 7 depicts a stage in a partial layer transfer method in an embodiment of the invention. FIG. 7 shows an example of how donor wafer 705, which is smaller than receiving wafer 701, is used in a partial layer transfer process. Specifically, in an embodiment donor wafer 705 (the top of which is shown in FIG. 7) has appropriate raised areas on its bottom (not shown) that when transferred to the receiving wafer 701, result in the donor layer portions shown in area 710 being deposited onto receiving wafer 701. Area 715 denotes areas of receiving wafer 701 that have not yet received a partial layer transfer. Notably the patterns in 715 and 710 are the same considering patterns in 710 show areas of successful partial layer transfer and the patterns of area 715 show the targets for future partial layer transfer.

FIG. 7 shows how donor wafer 705 is translated across receiver wafer 701 and also stepped so a new layer portion is always ready for deposit onto a new area of receiver wafer (i.e., avoid double layer transfer in stepped overlap areas so no one portion of the donor wafer is transferred, or attempted to be transferred, twice). This may or may not be necessary depending on processing requirements. In other words, depending on how much material is transferred from the donor wafer, the donor wafer could be re-used at each step if an appropriate translation of the donor wafer is done. Having raised areas on the donor wafer eliminates areas of double layer transfer during the stepping process. The transfer from a single donor wafer can be repeated multiple times with different materials from different donor wafers when a separate bonding structure is fabricated on the receiving wafer for each bonding step.

Put another way, in an embodiment (as described above) the donor wafer may have the raised oxide/bonding material surfaces. Therefore, a first donor wafer with a first material may be transferred to a single portion of receiving wafer. Then a second donor wafer with a second material (unequal to the first material in lattice constant and/or material composition) having raised oxide/bonding materials surfaces may be transferred to different portions of the single portion of the receiver than was the case with the first donor wafer.

Figure 8:
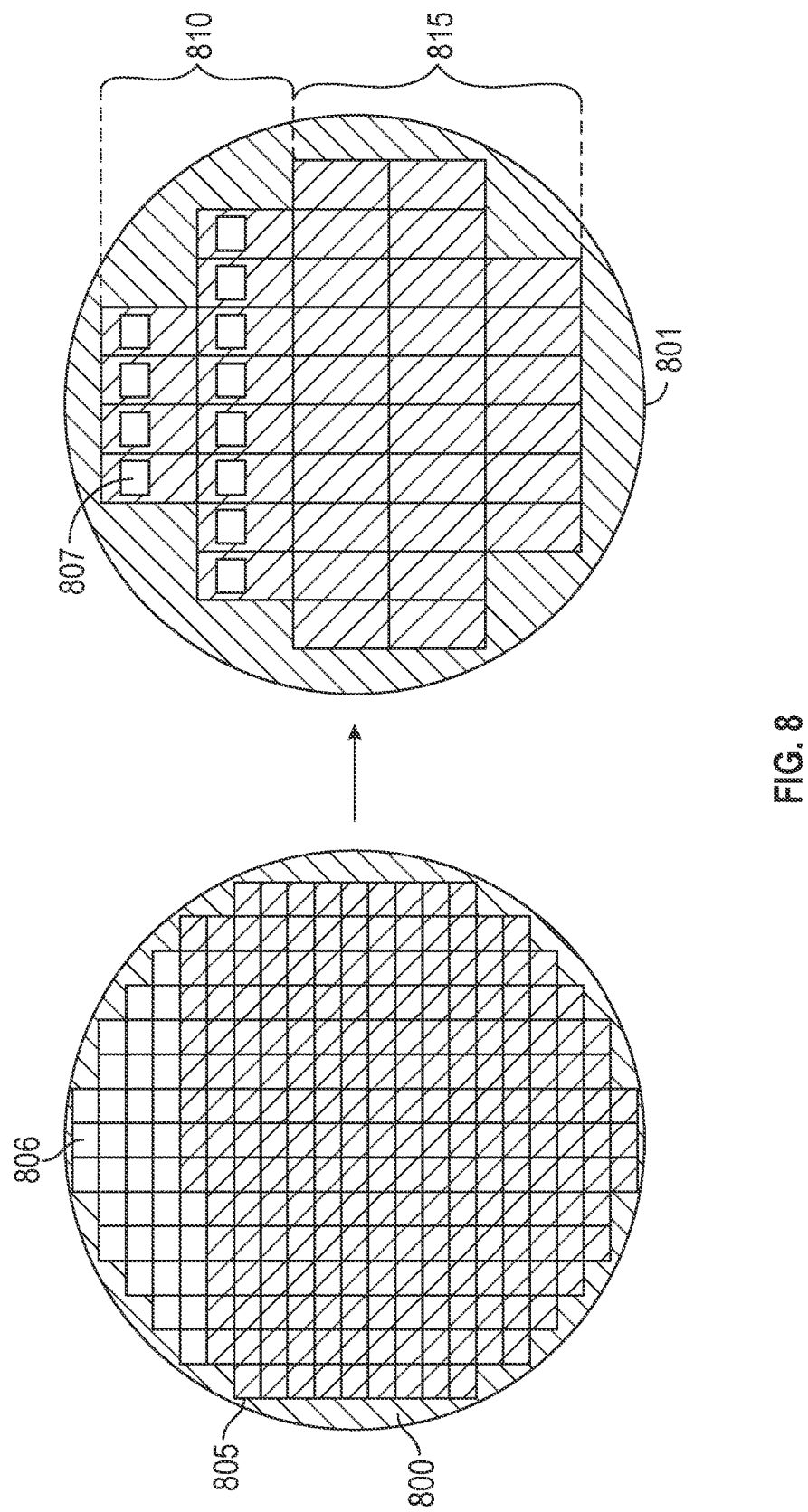
FIG. 8 depicts a stage in a partial layer transfer method in an embodiment of the invention.

In another embodiment, as mentioned above, a donor wafer is prepared and cleaving layer is formed or substituted for by an etchable or releasable material. Unlike the above process described in conjunction with FIG. 7, in FIG. 8 the donor layer 800 is diced into small areas such as the rectangular or square areas (e.g., area 805). This can be done with a laser, saw, or any conventional method to partially saw through the thin donor layer. The separated portions may then be transferred to the receiving wafer 801 by "pick and place" methods or using a self-assembly method. During a "pick and place" method the "separating" layer must be released. In the case of using helium and/or hydrogen heat will cause the separation. In the case of an undercut method, an etch process would be used. Another possibility is to transfer the full thickness islands and grind them back to the desired thickness. As seen in FIG. 8, area 810 shows 12 instances where donor layers portions have been transferred to receiver wafer 801 while 26 areas (see area 815) remain unoccupied and awaiting layer transfer.

The process corresponding to FIG. 7 concerns islands being created by using topology on the receiving wafer to control the transferred areas. The process corresponding to FIG. 8 concerns island shapes that are created before bonding and their placement is controlled by a physical attachment processing (rather than by topology like FIG. 7). The choice of methodology (FIG. 7 vs. FIG. 8) may be dictated by the desired size of islands where the process for FIG. 7 may work better for very small islands due to possible difficulties associated with manipulating small islands (element 805) as required for FIG. 8.

Above a layer transfer process includes heating a cleaving layer. However, other embodiments may use other layer transfer processes wherein, for example, a plasma immersion ion implantation (PIII) process may be used to form the release interface, a low-power plasma process is used at room temperature to chemically bond the oxide on the donor wafer to the receiving wafer, and then a pressurized air burst, such as at room temperature, is used to initiate a crack in the release interface, and then a chemical vapor etch is performed to finish the release interface.

As used herein "layer" includes a material portion at a certain height within a device and such a portion is not necessarily monolithic with one another portion or layer or even the same material as one another portion or layer at the same height.

As mentioned above, the donor and receiving device layers may have different materials and each may include at least one of differing IV, III-V, and II-VI materials such as Ge, SiGe, GaAs, AlGaAs, InGaAs, InAs, and InSb. The lattice mismatch between the two portions may be less than 1% or 2, 3, 4, 5, 6, 7, 8, 9, 10, 11, 12% or more.

Example 1 includes a first layer, including a first semiconductor switching element, coupled to a first portion of a first bonding material; and a second layer, including a second semiconductor switching element, coupled to a second portion of a second bonding material; wherein (a) the first layer is over the second layer, (b) the first portion is directly connected to the second portion, and (c) first sidewalls of the first portion are unevenly serrated.

In example 2 the subject matter of the Example 1 can optionally include wherein second sidewalls of the second portion are smoother than the first sidewalls.

In example 3 the subject matter of the Examples 1-2 can optionally include wherein second sidewalls of the second portion are not unevenly serrated.

In example 4 the subject matter of the Examples 1-3 can optionally include wherein second sidewalls of the second portion are vertically aligned with the first sidewalls.

In example 5 the subject matter of the Examples 1-4 can optionally include wherein additional sidewalls of the first layer are vertically aligned with the first sidewalls and are unevenly serrated.

In example 6 the subject matter of the Examples 1-5 can optionally include wherein the first layer is over and directly contacting the first portion, the first layer includes a single crystal layer and the first and second portions each include an oxide.

In example 7 the subject matter of the Examples 1-6 can optionally include wherein the second semiconductor switching element is a CMOS switching element.

In example 8 the subject matter of the Examples 1-7 can optionally include wherein the first semiconductor switching element is a non-CMOS switching element.

In example 9 the subject matter of the Examples 1-8 can optionally include a bonding layer between the first and second portions.

In example 10 the subject matter of the Examples 1-9 can optionally include wherein the first and second portions each include at least one of a metal, an oxide, and a polymer adhesive.

In example 11 the subject matter of the Examples 1-10 can optionally include wherein the first sidewalls are generally not orthogonal to the second layer.

In example 12 the subject matter of the Examples 1-11 can optionally include an interconnect extending from the first layer to the second layer.

In example 13 the subject matter of Examples 1-12 can optionally include wherein the first sidewalls are not formed by etching.

In example 14 the subject matter of the Examples 1-13 can optionally include wherein the first layer is transferred, already formed, onto the second layer.

In example 15 the subject matter of the Examples 1-14 can optionally include wherein the first and second layers respectively comprise first and second materials that each include at least one of group IV and III-V materials and the first material is not the same as the second material.

In example 16 the subject matter of the Examples 1-15 can optionally include wherein the first and second materials are lattice mismatched with each other.

In example 17 the subject matter of the Examples 1-16 can optionally include wherein the second portion is coplanar with the second layer and also extends above the second layer by no more than 50 nm.

Example 18 includes a method comprising: providing a first layer coupled to a first portion of a first bonding material; and a second layer coupled to a second portion of a second bonding material; and partially transferring the first layer over and onto the second layer based on directly connecting the first portion to the second portion and, afterwards, separating a first section of the first layer from a second section of the first layer leaving the first section coupled to the second layer but decoupling the second section from the second layer; wherein first sidewalls of the first portion are unevenly serrated based on separating the first section from the second section.

In example 19 the subject matter of the Example 18 can optionally include wherein at least one of the first and second portions is columnar and includes a horizontal surface and vertical surfaces, wherein the horizontal and vertical surfaces are all uncovered and exposed when directly connecting the first portion to the second portion.

In example 20 the subject matter of the Example 18-19 can optionally include wherein the first layer is included in a donor wafer having a first maximum diameter and the second layer is included in a receiving wafer having a second maximum diameter greater than the first maximum diameter.

In example 21 the subject matter of the Example 18-20 can optionally include wherein separating the first section from the second section includes fracturing a layer that includes at least one of hydrogen and helium.

In example 22 the subject matter of the Example 18-21 can optionally include stepping a part of the first layer, which was separated from the first section, over a part of the second layer that is not connected to the first portion; and partially transferring a subpart of the part onto the second layer.

Example 23 includes an apparatus comprising: a first layer coupled to a first portion of a first bonding material; and a second layer coupled to a second portion of a second bonding material; wherein (a) the first layer is over the second layer, (b) the first portion is directly connected to the second portion, (c) first sidewalls of the first portion are unevenly serrated and second sidewalls of the second portion are smoother than the first sidewalls, and (d) the first and second sidewalls are vertically aligned with each other.

In example 24 the subject matter of the Example 23 can optionally include wherein the first layer directly contacts the first portion, the first layer includes a single crystal layer, and the first and second portions each include at least one of an oxide and a metal.

In example 25 the subject matter of the Examples 23-24 can optionally include wherein the first and second layers respectively comprise first and second materials that each include at least one of group IV and III-V materials and are lattice mismatched with each other.

The foregoing description of the embodiments of the invention has been presented for the purposes of illustration and description. It is not intended to be exhaustive or to limit the invention to the precise forms disclosed. This description and the claims following include terms, such as left, right, top, bottom, over, under, upper, lower, first, second, etc. that are used for descriptive purposes only and are not to be construed as limiting. For example, terms designating relative vertical position refer to a situation where a device side (or active surface) of a substrate or integrated circuit is the "top" surface of that substrate; the substrate may actually be in any orientation so that a "top" side of a substrate may be lower than the "bottom" side in a standard terrestrial frame of reference and still fall within the meaning of the term "top." The term "on" as used herein (including in the claims) does not indicate that a first layer "on" a second layer is directly on and in immediate contact with the second layer unless such is specifically stated; there may be a third layer or other structure between the first layer and the second layer on the first layer. The embodiments of a device or article described herein can be manufactured, used, or shipped in a number of positions and orientations. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. An apparatus comprising:
   a first layer, including a first semiconductor switching element, coupled to a first portion of a first bonding material; and
   a second layer, including a second semiconductor switching element, coupled to a second portion of a second bonding material;
   wherein (a) the first layer is over the second layer, (b) the first portion is directly connected to the second portion, and (c) first sidewalls of the first portion are unevenly serrated.

2. The apparatus of claim 1, wherein second sidewalls of the second portion are smoother than the first sidewalls.

3. The apparatus of claim 1, wherein second sidewalls of the second portion are not unevenly serrated.

4. The apparatus of claim 1, wherein second sidewalls of the second portion are vertically aligned with the first sidewalls.

5. The apparatus of claim 1, wherein additional sidewalls of the first layer are vertically aligned with the first sidewalls and are unevenly serrated.

6. The apparatus of claim 1, wherein the first layer is over and directly contacting the first portion, the first layer includes a single crystal layer, and the first and second portions each include an oxide.

7. The apparatus of claim 6 including a bonding layer between the first and second portions.

8. The apparatus of claim 1, wherein at least one of the first semiconductor switching element or the second semiconductor switching element includes at least one of a transistor or a diode.

9. The apparatus of claim 8, wherein the first semiconductor switching element is a non-CMOS switching element and the second semiconductor switching element is a CMOS switching element.

10. The apparatus of claim 1, wherein the first and second portions each include at least one of an oxide and a polymer adhesive.

11. The apparatus of claim 10, wherein the first sidewalls are generally not orthogonal to a top surface of the second layer, the top surface being between the first and second layers.

12. The apparatus of claim 1 including an interconnect extending from the first layer to the second layer.

13. The apparatus of claim 1, wherein the first and second layers respectively comprise first and second materials that each include at least one of group IV or III-V materials and the first material is not the same as the second material.

14. The apparatus of claim 13, wherein the first and second materials are lattice mismatched with each other.

15. The apparatus of claim 1, wherein the second portion is co-planar with the second layer and also extends above the second layer by no more than 50 nm.

16. The apparatus of claim 1 wherein (d) a first face of the first portion directly contacts a second face of the second portion, (e) an interface between the first and second faces substantially defines a first plane, (f) one of the first sidewalls substantially defines a second plane, (g) the second plane is not parallel to the first plane, (g) the first sidewalls are opposite sidewalls to one another, (h) a horizontal axis intersects each of the first sidewalls, and (i) the first sidewalls do not directly contact each other.

17. The apparatus of claim 16 wherein the second plane is substantially orthogonal to the first plane.

18. The apparatus of claim 1 wherein:
   a first surface of the first layer substantially defines a first plane;
   a second surface of the first layer substantially defines a second plane that is substantially parallel to the first plane;
   a first surface of the first portion substantially defines the second plane and directly contacts the second surface of the first layer;
   a second surface of the first portion substantially defines a third plane that is substantially parallel to the first plane;
   a maximum width of the first surface of the first layer is not greater than a maximum width of the first surface of the first portion.

19. A method comprising:
   providing a first layer coupled to a first portion of a first bonding material; and a second layer coupled to a second portion of a second bonding material; and
   partially transferring the first layer over and onto the second layer based on directly connecting the first portion to the second portion and, afterwards, separating a first section of the first layer from a second section of the first layer leaving the first section coupled to the second layer but decoupling the second section from the second layer;
   wherein first sidewalls of the first portion are unevenly serrated based on separating the first section from the second section.

20. The method of claim 19, wherein at least one of the first and second portions is columnar and includes a horizontal surface and vertical surfaces, wherein the horizontal and vertical surfaces are all uncovered and exposed when directly connecting the first portion to the second portion.

21. The method of claim 20, wherein the first layer is included in a donor wafer having a first maximum diameter and the second layer is included in a receiving wafer having a second maximum diameter greater than the first maximum diameter.

22. The method of claim 20 comprising:
   stepping a part of the first layer, which was separated from the first section, over a part of the second layer that is not connected to the first portion; and
   partially transferring a subpart of the part of the first layer onto the second layer.

23. An apparatus comprising:
a first layer coupled to a first portion of a first bonding material; and
a second layer coupled to a second portion of a second bonding material;
wherein (a) the first layer is over the second layer, (b) the first portion is directly connected to the second portion, (c) first sidewalls of the first portion are unevenly serrated and second sidewalls of the second portion are smoother than the first sidewalls, and (d) the first and second sidewalls are vertically aligned with each other.

24. The apparatus of claim 23, wherein the first layer directly contacts the first portion, the first layer includes a single crystal layer, and the first and second portions each include at least one of an oxide or a metal.

25. The apparatus of claim 23, wherein the first and second layers respectively comprise first and second materials that each include at least one of group IV or III-V materials and are lattice mismatched with each other.

* * * * *